United States Patent
Wiener

(10) Patent No.: US 7,024,440 B2
(45) Date of Patent: Apr. 4, 2006

(54) METHOD AND SYSTEM FOR PROCESSING A DISCRETE TIME INPUT SIGNAL WHERE THE CLOCK RATE OF A DISCRETE TIME OUTPUT SIGNAL IS A MULTIPLE OF THE CLOCK RATE OF INPUT SIGNAL SAMPLES

(75) Inventor: Roberto B. Wiener, Bethel, CT (US)

(73) Assignee: ASML Holding N.V., (NL)

( * ) Notice: Subject to any disclaimer, the term of this patent is extended or adjusted under 35 U.S.C. 154(b) by 8 days.

(21) Appl. No.: 10/806,094

(22) Filed: Mar. 23, 2004

(65) Prior Publication Data

US 2004/0177103 A1 Sep. 9, 2004

Related U.S. Application Data

(62) Division of application No. 09/757,622, filed on Jan. 11, 2001, now Pat. No. 6,766,339.

(51) Int. Cl.
*G06F 17/10* (2006.01)
(52) U.S. Cl. ...................... 708/319; 708/313
(58) Field of Classification Search ............... 708/319, 708/313
See application file for complete search history.

(56) References Cited

U.S. PATENT DOCUMENTS

| 5,111,417 A | 5/1992 | Belloc et al. |
| 5,610,942 A | 3/1997 | Chen et al. |
| 5,783,974 A * | 7/1998 | Koslov et al. ............... 332/103 |
| 5,978,420 A * | 11/1999 | Koslov et al. ............... 375/295 |
| 5,978,823 A * | 11/1999 | Koslov et al. ............... 708/313 |
| 6,052,701 A * | 4/2000 | Koslov et al. ............... 708/313 |
| 6,427,157 B1 | 7/2002 | Webb |
| 2004/0205425 A1 | 10/2004 | Wiener |

FOREIGN PATENT DOCUMENTS

EP 0 820 145 A2 1/1998

OTHER PUBLICATIONS

Copy of International Search Report from PCT Application No. PCT/US02/00556, 6 pages, mailed Sep. 18, 2002.
Proakis, John G., et al., *Digital Signal Processing: Principles, Algorithms, and Applications*, 3rd Edition, 1996, Prentice Hall (entire book).

* cited by examiner

*Primary Examiner*—D. H. Malzahn
(74) *Attorney, Agent, or Firm*—Sterne, Kessler, Goldstein & Fox P.L.L.C.

(57) ABSTRACT

A method and system of efficiently processing a discrete time input signal having a plurality of input signal samples that occur at a first clock rate into a discrete time output signal having a second clock rate that is R times the first clock rate is presented. The method includes receiving the input signal and filtering the input signal with an N-taps finite impulse response (FIR) filter having N filter coefficients. The method reduces the number of required operations and reduces computational errors in the filtering and interpolation of discrete input signals.

8 Claims, 14 Drawing Sheets

——— 5 PTS LINEAR
——— 2 PTS LINEAR, ALPHA= 1/5
——— 2 PTS LINEAR, ALPHA= 1/20
——— 3 PTS LAGRANGE

——— 5 PTS LINEAR
——— 2 PTS LINEAR, ALPHA= 1/5
——— 2 PTS LINEAR, ALPHA= 1/20
——— 3 PTS LAGRANGE

5 PTS LINEAR

2 PTS LINEAR, ALPHA=1/5

2 PTS LINEAR, ALPHA=1/20

3 PTS LAGRANGE

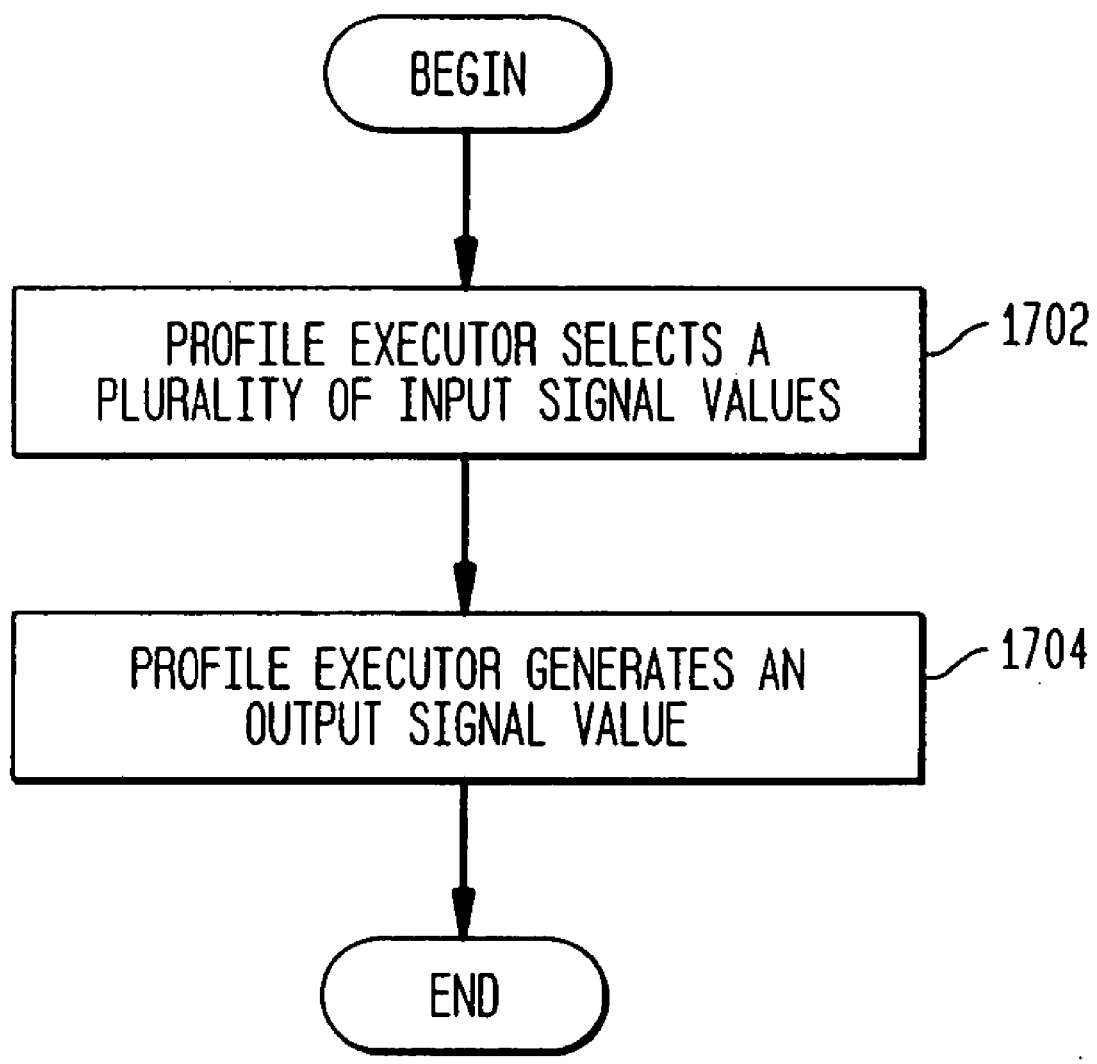

METHOD AND SYSTEM FOR PROCESSING A DISCRETE TIME INPUT SIGNAL WHERE THE CLOCK RATE OF A DISCRETE TIME OUTPUT SIGNAL IS A MULTIPLE OF THE CLOCK RATE OF INPUT SIGNAL SAMPLES

CROSS REFERENCE TO RELATED APPLICATIONS

This application is a Divisional patent application of U.S. patent application Ser. No. 09/757,622, filed Jan. 11, 2001, now U.S. Pat. No. 6,766,339 B2, issued Jul. 20, 2004, which is hereby incorporated herein by reference in its entirety.

This application is related to U.S. patent application Ser. No. 10/806,325, filed Mar. 23, 2004, entitled "Method and System for Efficient and Accurate Processing of a Discrete Time Input Signal," having the same inventor, which is hereby incorporated herein by reference in its entirety.

BACKGROUND OF THE INVENTION

1. Field of the Invention

The present invention relates to signal processing. More particularly, the present invention relates to efficient and accurate filtering and interpolation techniques for discrete time input signals.

2. Related Art

Many industrial processes involve motion along trajectories that are defined by precise positions at specific times. Photolithography is an example of such a process. In a photolithography process, an illumination source projects an illumination beam. The beam passes through, or is reflected off, a reticle to enable the transfer of a reticle image from the reticle to a substrate, such as a semiconductor wafer.

Scanning techniques are employed in photolithography processes to project a reticle image onto a substrate. These scanning techniques involve moving a reticle across an illumination slot to allow the reticle image to be exposed onto a substrate that is simultaneously moving. Reticles and substrates are disposed on stages that are capable of motion in one or more dimensions.

To provide precise movement in such processes, automated command and control systems are needed. These command and control systems often employ signal processing techniques to govern these processes. However, signal processing techniques can be computationally expensive and slow. In addition, processing platforms, such as microcontrollers, that implement such techniques can introduce unacceptable computational errors. Accordingly, what is needed are signal processing techniques for such systems that induce minimal computational errors, require a minimal number of processing operations, and execute in a minimal amount of time.

SUMMARY OF THE INVENTION

The present invention is directed to efficient and accurate interpolation techniques. A method of the present invention efficiently processes a discrete time input signal having a plurality of input signal samples that occur at a first clock rate into a discrete time output signal having a second clock rate that is R times the first clock rate. This method includes receiving the input signal and filtering the input signal with an N-taps finite impulse response (FIR) filter having N filter coefficients. This occurs in an efficient manner that takes advantage of a "zero padding" operation.

The present invention advantageously enables interpolation and filtering functions to be performed with a minimum number of processor operations. Furthermore the present invention advantageously provides accurate signal processing results. These techniques are applicable in many different applications, such as process control.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

FIG. 17 is a flowchart illustrating an operational sequence involving efficient interpolation and filtering;

DETAILED DESCRIPTION OF THE PREFERRED EMBODIMENTS

I. Operational Environment

Figure 1:
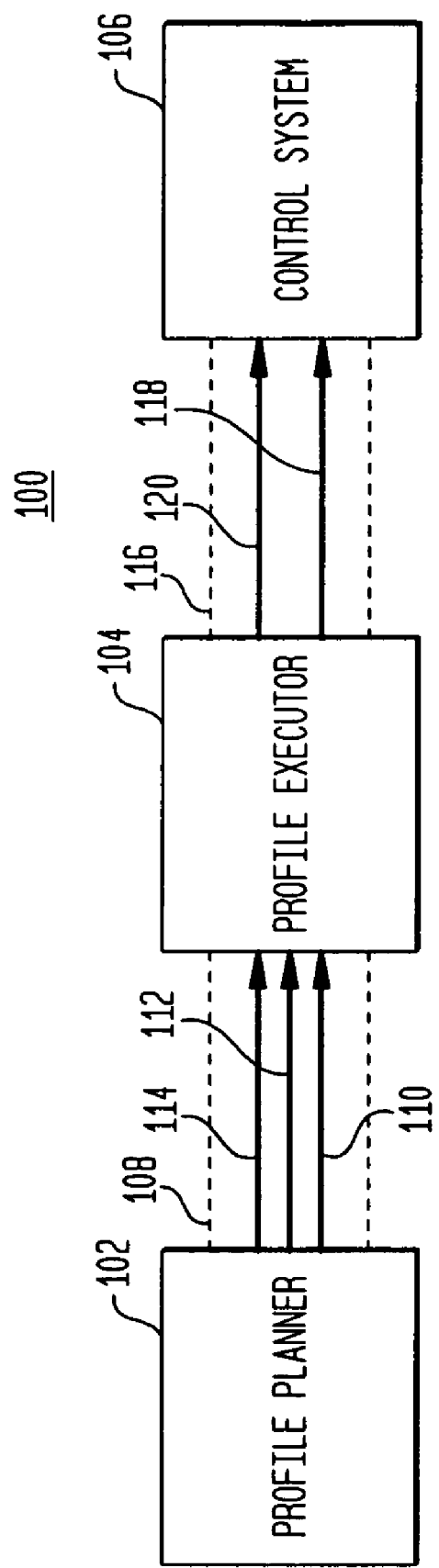
FIG. 1 is a block diagram of an exemplary operational environment.

Before describing the invention in detail, it is useful to describe an example environment in which the invention can be implemented. As the invention is directed to signal processing techniques, it is particularly useful in photolithography applications, such as profile planning and the command and control of photolithography scanning processes. FIG. 1 illustrates such an environment.

FIG. 1 is a block diagram of an exemplary operational environment 100. Operational environment 100 includes a profile planner 102, a profile executor 104, and a control system 106. Profile planner 102 designs device trajectories in accordance with user-specified requirements. This design process results in the generation of a state signal set 108 that defines a trajectory for a device, such as a scanning trajectory for a substrate stage or a reticle stage in a photolithography tool. Profile planner 102 is implemented as a computer program product that is executed by a double precision computer. However, profile planner 102 can also be implemented in hardware and/or firmware. Profile planner 102 designs these trajectories in an off-line process. Thus, in the case of photolithography, state signal set 108 is generated prior to commencement of substrate stage or reticle scanning operations.

State signal set 108 defines a plurality of constant acceleration states that govern the motion of a device, such as a substrate stage or a reticle stage, that is included in control system 106. State signal set 108 includes a position state signal 110, a velocity state signal 112, and an acceleration state signal 114, which are described below in connection with FIG. 2. For each constant acceleration state, state signals 110, 112, and 114 have corresponding values. These constant acceleration states exist for variable length intervals that are integer multiples of a slow clock period. These state signals have values spaced at non-equidistant intervals in time. These intervals in time are integer multiples of a slow clock period, such as 1 millisecond.

Figure 2:
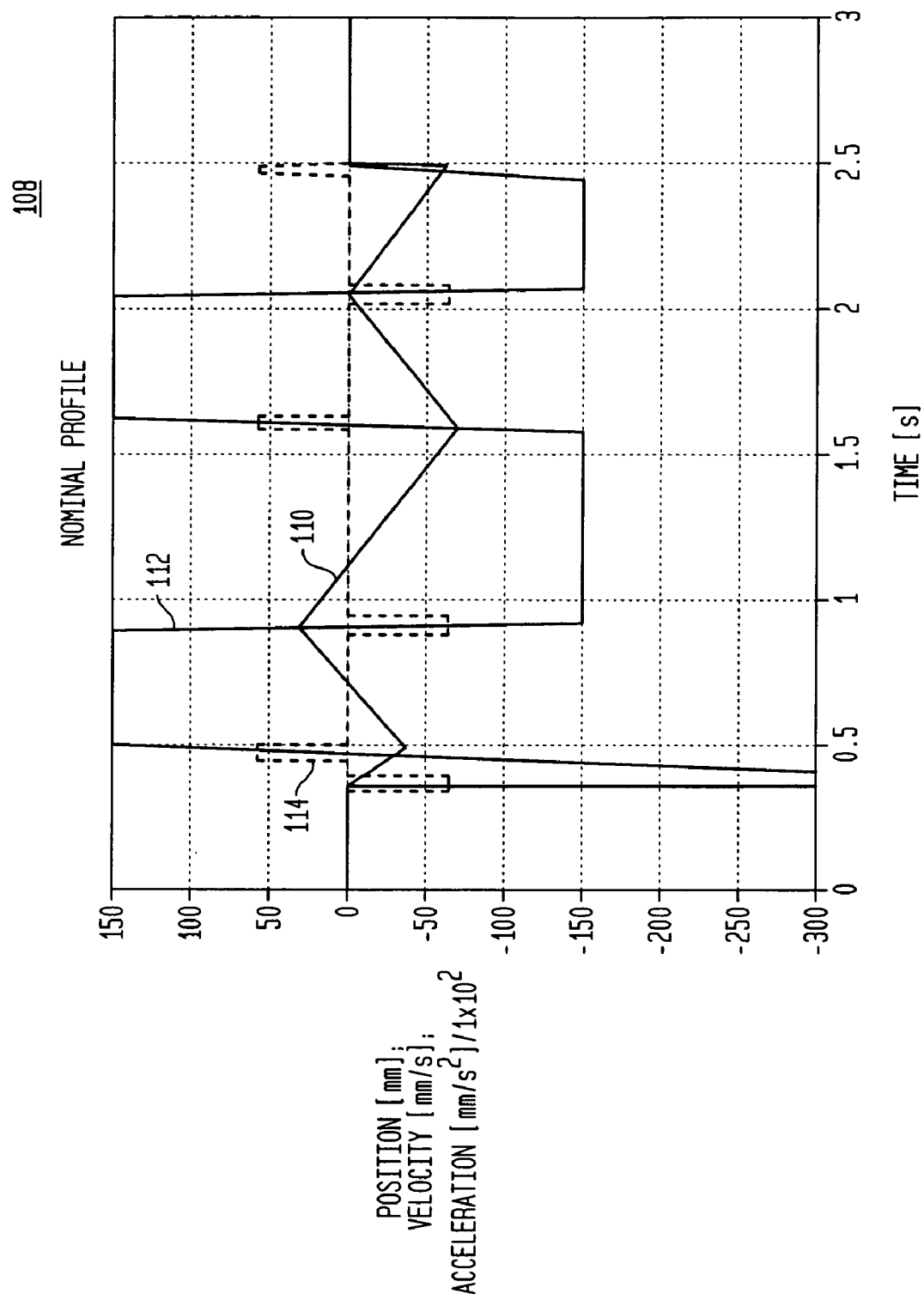
FIG. 2 is a chart illustrating an exemplary state signal set 108.

FIG. 2 is a chart illustrating an exemplary state signal set 108. As described above, state signal set 108 includes position state signal 110, velocity state signal 112, and acceleration state signal 114. These state signals generated by profile planner 102 define motion in a single dimension for a device, such as a substrate stage or a reticle stage.

Relationships between these signals can be expressed as $P=P_i+\frac{1}{2}At^2+V_i t$ and $V=V_i+At$. In these expressions, where $P_i$ represents position state signal 110, P represents a position signal (described below with reference to FIG. 3 as signal 350), A represents acceleration state signal 114, $V_i$ represents velocity state signal 112, and V represents a velocity signal (used in preprocessing component 340 described below with reference to FIG. 3). As shown in FIG. 2, position state signal 110 is a non-equidistantly sampled second order curve. Accordingly, velocity state signal 112 is a non-equidistantly sampled trapezoidal signal.

Acceleration state signal 114 includes a series of square and/or rectangular pulses that can have any amplitude and width. These pulses correspond to transitions in velocity state signal 112 values. At the rising and falling edges of these pulses, acceleration state signal 114 has a first derivative with respect to time that is large. This first derivative is referred to herein as "jerk" (not shown). Since these rising and falling edges provide for square and/or rectangular pulses, acceleration state signal 114 has jerk values that are infinity (i.e., delta functions).

As shown in FIG. 2, the values of velocity state signal 112 and acceleration state signal 114 only change at specific times defined by profile planner 102. Thus, instead of being represented by sets of samples that are uniformly spaced in time, these signals are represented by values corresponding to specific moments in time when acceleration state signal 114 changes. As described above, these moments are separated by time intervals that are integer multiples of the slow clock period.

Referring again to FIG. 1, profile executor 104 receives state signal set 108 from profile planner 102 and converts these signals into an output signal set 116. Output signal set 116 includes a real time position signal and a real time acceleration output signal. These output signals (described in greater detail with reference to FIGS. 3 and 4) correspond to state signal set 108, but are discrete time signals occurring at a fixed fast clock rate. An exemplary fast clock rate is 16 kHz. Discrete time signals occurring at this fast clock rate have values spaced at 0.0625 millisecond time intervals. The process of increasing the clock rate of a discrete time signal is referred to herein as interpolation. Profile executor 104 sends output signal set 116 to control system 106.

In generating output signal set 116, profile executor 104 filters the state signals of state signal set 108 to reduce excessive jerk, such as those described above with reference to FIG. 2. In so doing, profile executor 104, through filtering, avoids exciting certain resonances in control system 106 and produces discrete time signals at the fast clock rate. Since this fast clock rate is greater than the slow clock rate associated with state signal set 108, profile executor 104 performs filtering and interpolation of state signals to produce an output signal set 116.

Output signal set 116 includes a position output signal 118 and an acceleration output signal 120. Like state signals 110–114, these signals are discrete signals. However, unlike state signals 110–114, position output signal 118 and acceleration output signal 120 each have values that are spaced at uniform time intervals. These uniform time intervals are equal to one period of the fast clock rate described above.

Profile executor 104 is implemented as a computer program product that is executed by a fixed precision arithmetic microcontroller, such as a SHARC® ADSP-21062 produced by Analog Devices, Inc. of Norwood, Mass.

Figure 3:
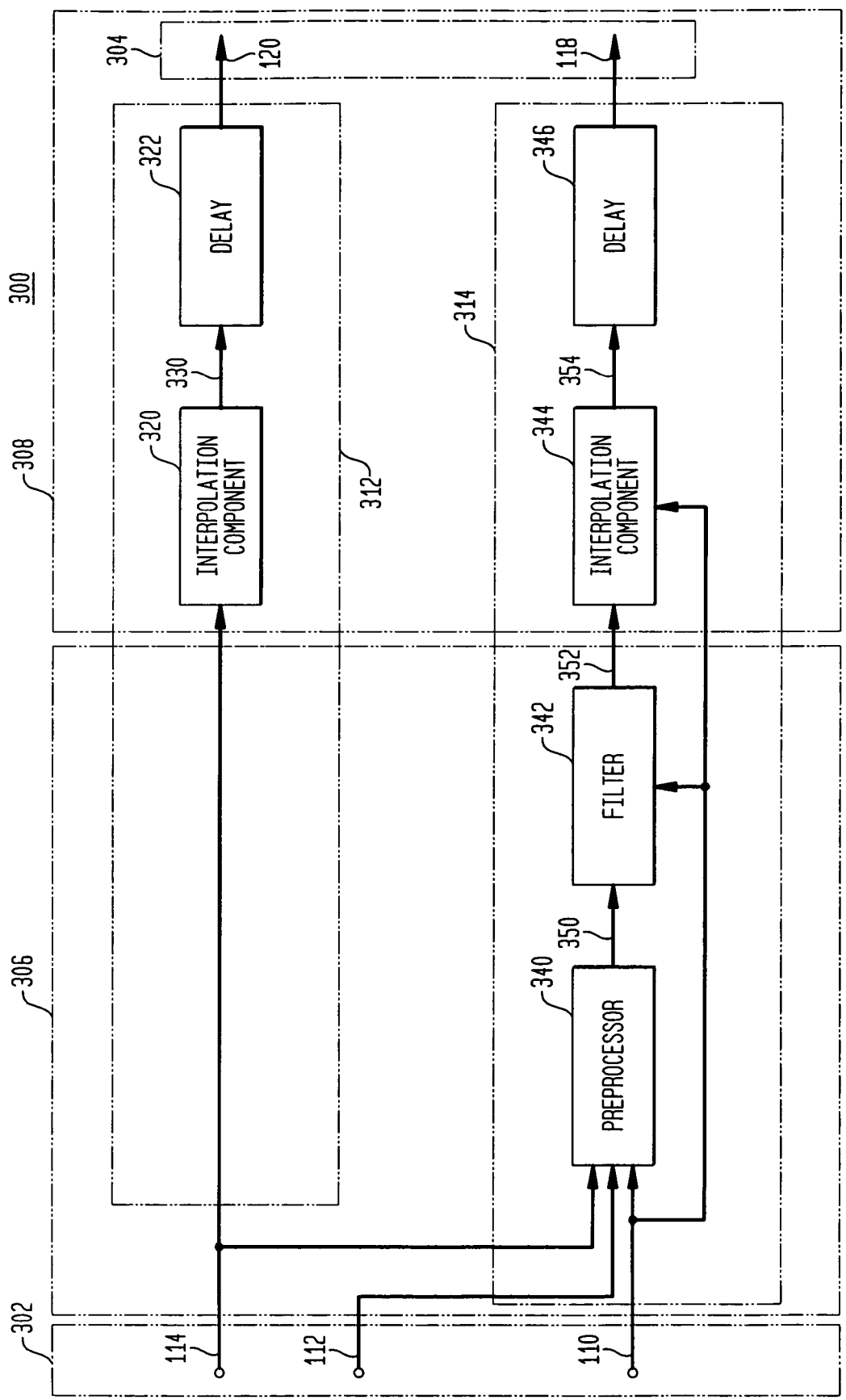
FIG. 3 is a block diagram of a profile executor implementation.

FIG. 3 is a block diagram of an implementation 300 of profile executor 104. Implementation 300 includes a state signal interface 302, an output signal interface 304, a slow clock portion 306, and a fast clock portion 308. State signal interface 302 receives state signal set 108 from profile planner 102. Output signal interface 304 sends output signal set 116 to control system 106.

Spanning slow and fast clock portions 306 and 308 are an acceleration signal path 312 and a position signal path 314. Acceleration signal path 312 receives acceleration state signal 114 from state signal interface 302 and generates acceleration output signal 120. Position signal path 314 receives state signals 110, 112, and 114 (i.e., state signal set 108) from state signal interface 302. Based on these received signals, position signal path 314 generates position output signal 118.

Both acceleration signal path 312 and position signal path 314 include a plurality of signal processing elements. These elements perform operations, such as filtering, upsampling, and signal delaying. These elements can be implemented as software functions written for execution by a microcontroller, such as a SHARC® ADSP-21062 produced by Analog Devices, Inc. of Norwood, Mass., or any other suitable processing platform, as would be apparent to persons skilled in the relevant art(s).

Among other functions, these elements perform interpolation and filtering of input state signals. For signal paths 312 and 314, this interpolation results in output signals 118 and 120 having the same clock rate.

Position signal path 314 includes a preprocessing component 340, a pre-interpolation filter 342, an interpolation component 344, and a time delay component 346. As described above, position signal path 314 receives state signal set 108 and generates position output signal 118.

Pre-processing component 340 receives position state signal 110, velocity state signal 112, and acceleration state signal 114. These signals are processed to generate an integrated position signal 350, which is at the slow clock rate. Integrated position signal 350 is based on acceleration state signal 114, velocity state signal 112 and position state signal 110. To generate integrated position signal 350, preprocessing component 340 performs a discrete time integration operation, which is expressed below in Equation (1-1):

$$P_n = P_i + nT^*[V_i + (nT^*A/2)] \qquad (1\text{-}1)$$

In Equation (1-1), $P_n$ represents integrated position signal 350, $P_i$ represents position state signal 110, $V_i$ represents velocity state signal 112, n is an integer representing a sample time at the slow clock rate, T is the slow clock period, and A represents acceleration state signal 114.

Pre-interpolation filter 342 receives position state signal 110, and integrated position signal 350. Pre-interpolation filter 342 processes these signals to generate filtered position signal 352. By generating filtered position signal 352, pre-interpolation filter 342 filters integrated position signal 350 to limit the frequency content of signal 352 before it is sent to interpolation component 344. Pre-interpolation filter 342 employs finite impulse response (FIR) filtering techniques that run at the slow clock rate. However, pre-interpolation filter 342 can employ other types of discrete time filtering techniques, such as infinite impulse response (IIR) filtering.

Interpolation component 344 receives filtered position signal 352 and position state signal 110. Upon receipt of these signals, interpolation component 344 performs two functions. First, interpolation component 344 performs an upsampling operation to create a signal that is at the fast clock rate. This upsampling operation involves inserting L−1 zeros between each sample.

Second, interpolation component 344 performs a filtering operation on the upsampled signal. This filtering operation prevents high frequency resonance components from being introduced by the upsampling function. The filtering is performed using a low-pass FIR filtering operation. However, other types of filtering, such as IIR filtering can be employed. Together, these upsampling and filtering operations are collectively referred to herein as interpolation. The result of this interpolation operation results in an interpolated signal 354, which is sent to time delay component 346.

Both pre-interpolation filter 342 and interpolation component 344 employ "delta processing" techniques to increase the precision of the filtering and interpolation operations that they perform. These delta processing techniques are described below in greater detail with reference to FIGS. 4 and 5.

Time delay component 346 receives interpolated signal 354. This component operates at the fast clock rate and enables the propagation time and phase of position signal path 314 to be adjusted. Time delay component 346 generates position output signal 118 and sends it to output signal interface 304.

The description now turns to acceleration signal path 312. Acceleration signal path 312 includes an interpolation component 320, and a time delay component 322. Acceleration signal path 312 receives acceleration state signal 114 from state signal interface 302 and generates acceleration output signal 120.

Interpolation component 320, like interpolation component 344, performs two functions. First, interpolation component 320 upsamples signal acceleration state signal 114 at an interpolation rate of L. Second, interpolation component 320 performs a filtering operation on this upsampled data. This FIR filtering operation prevents high frequency resonance components from being introduced by the upsampling function. As a result of these functions, interpolation component 320 produces an interpolated acceleration signal 330 that is transferred to time delay component 322.

Time delay component 322 receives interpolated acceleration signal 330 and enables the propagation time and phase of acceleration signal path 312 to be adjusted. By incurring such delays, time delay component 322 generates acceleration output signal 120, which is sent to output interface 304.

II. Delta Processing

Elements of profile executor 104, such as filter 342 and interpolation component 344 employ a delta processing feature. This feature reduces computational errors in output signals, such as position output signal 118. Delta processing involves subtracting position state signal 110 from time varying signals that represent an absolute position. This subtraction results in "delta signals" that have a smaller dynamic range than the corresponding signals that represent an absolute position.

Figure 4:
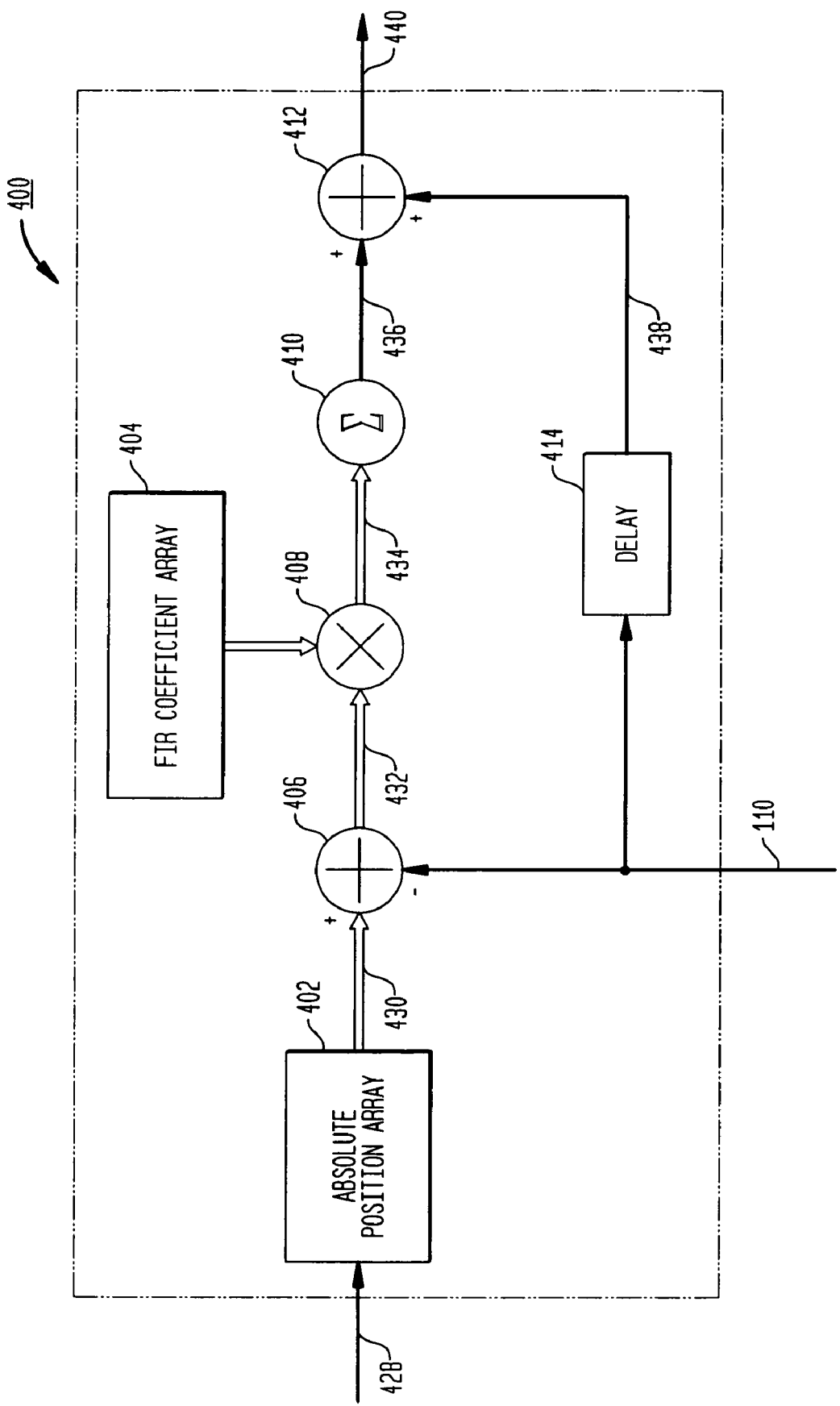
FIG. 4 is a block diagram of a filter that employs delta processing.

FIG. 4 is a block diagram illustrating an implementation 400 of filter 342 that employs delta processing. Implementation 400 includes an absolute position array 402, an FIR coefficient array 404, a first scalar summation node 406, a vector product node 408, a vector summation node 410, a second scalar summation node 412, and a delay module 414.

Absolute position array 402 receives an input signal 428 (i.e., integrated position signal 350) from preprocessing component 340. Absolute position array 402 processes integrated position signal 350 to provide a parallel position signal set 430. Parallel position signal set 430 includes a plurality of discrete time signals. For each of these discrete time steps, these signals include a plurality of contiguous values selected from signal 350. Thus, through parallel position signal set 430, absolute position array 402 concurrently sends scalar summation node 406 a plurality of contiguous values from signal 350.

Scalar summation node 406 receives parallel position signal set 430 and position state signal 110. Scalar summation node 406 subtracts position state signal 110 from each of the signals within parallel signal set 430. This subtraction produces a delta parallel signal set 432, which is sent to vector product node 408. Signal set 432 has a delta magnitude scale. This scale is smaller than the absolute magnitude scale of signal set 430.

Vector product node 408 performs an element-by-element multiplication on delta parallel signal set 432 and a plurality of FIR filter coefficients that are stored in FIR coefficient array 404. This multiplication produces a parallel product signal set 434, which is sent to vector summation node 410.

Vector summation node 410 sums each of the signals within parallel product signal set 434. This summation results in a single (i.e., a scalar) delta filtered signal 436.

Scalar summation node 412 receives delta filtered signal 436 and a delayed position state signal 438. Delayed position state signal 438 is position state signal 110 that is delayed a predetermined delay time by delay module 414. This predetermined delay time matches the propagation delays associated with the above described transfer of signals between summation nodes 406 and 412.

Scalar summation node 412 adds delta filtered signal 436 and delayed position state signal 438, thereby producing filtered position signal 352. This addition returns filtered signal 436 from a delta scale to an absolute scale. As described herein, filtered position signal 352 is sent to interpolation component 344.

The delta processing approach of implementation 400 enables filter 342 to minimize round up errors incurred by computations (i.e., summations and multiplications) that are associated with filtering operations. This error minimization is achieved through the subtraction of position state signal 110 from parallel position signal set 430 at scalar summation node 406. This subtraction results in signal set 432, which has a smaller magnitude than signal set 430.

In fixed precision processing environments, round up error due to fixed precision numeric representations are a direct function of the magnitude of input signals. By reducing the magnitude of input signals, as in delta parallel signal set 432, the computations performed at nodes 408 and 410 are minimized. This minimization yields an output signal 440 (i.e., filtered position signal 352) that has smaller errors.

Figure 5:
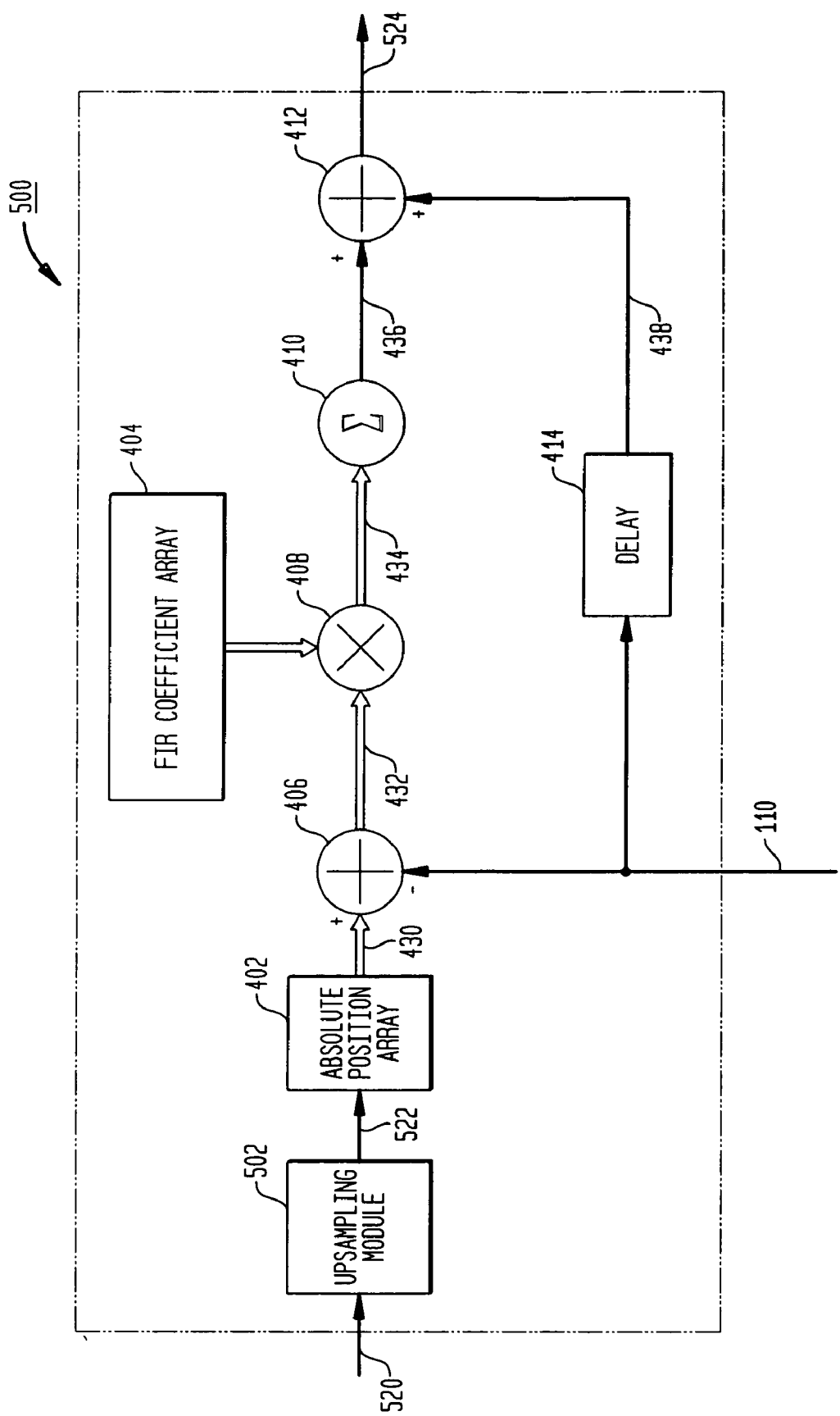
FIG. 5 is a block diagram of an interpolation component that employs delta processing.

FIG. 5 is a block diagram illustrating an implementation 500 of interpolation component 344. Implementation 500 is similar to implementation 400. However, implementation 500 includes an upsampling module 502 that increases the sampling rate of an input signal 520 (i.e., filtered position signal 352), thereby producing an upsampled signal 522, which is sent to absolute position array 402. Implementation 500 also receives position state signal 110 in order to employ the delta processing feature of implementation 400 that is described above with reference to FIG. 4. Thus, like implementation 400, the delta processing technique employed by implementation 500 produces an output signal 524 (i.e., interpolated signal 354) that has smaller errors.

Thus, the present invention includes a technique for efficiently processing a discrete time input signal, p(n), having a first clock rate into a discrete time output signal having a second clock rate. This technique minimizes computational errors.

Figure 6:
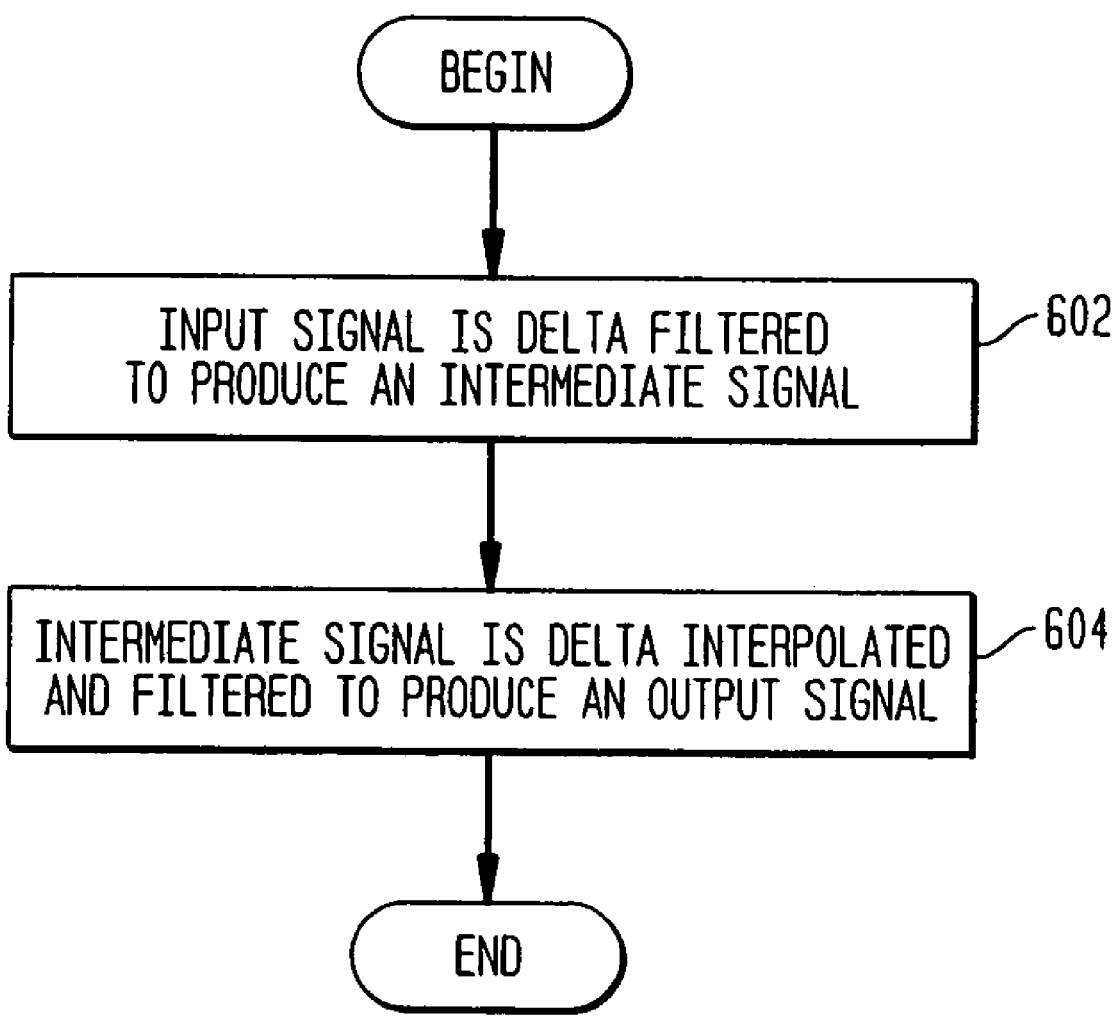
FIG. 6 is a flowchart illustrating an operation of an efficient processing technique.

FIG. 6 is a flowchart illustrating an operation of this efficient processing technique. This operation begins with a step 602. In step 602, the input signal is delta filtered to produce an intermediate signal having the first clock rate. Using implementation 300 of profile executor 104 as an example, filter 342 performs step 602. Thus, in this example, the input signal is position signal 350 and the intermediate signal is filtered position signal 352.

Step 602 includes the step of calculating an input delta signal, d(n), according to d(n)=p(n)−$p_i$, where $p_i$ is an initial value of p(n). With reference to implementation 400 of filter 342, $p_i$ is position state signal 110 and this calculation is performed by scalar summation node 406. Step 602 further includes the steps of generating a filtered delta signal f(n) from d(n), and adding $p_i$ to f(n), thereby generating the intermediate signal. Delta filtered signal 436 provides an exemplary f(n).

Next, in a step 604, the intermediate signal is delta interpolated to produce the output signal. Again, using profile executor 104 as an example, interpolation component 344 performs step 604. Thus, in this example, the output signal is interpolated signal 354.

Step 604 includes the step of upsampling the intermediate signal to the second clock rate. Upsampling module 502 provides an exemplary performance of this step, where upsampled signal 522 is an example of the upsampled intermediate signal. Step 604 also includes the steps of calculating an upsampled intermediate delta signal, u(n), according to u(n)=i(n)−$p_i$, where i(n) is the upsampled intermediate signal and $p_i$ is an initial value of p(n). With reference to implementation 500 of interpolation module 344, position state signal 110 provides an example of $p_i$, and delta parallel signal set 432 provides an example of u(n).

In addition, step 604 includes generating a filtered intermediate delta signal g(n) from u(n). With reference to implementation 500 of interpolation component 344, delta filtered signal 436 is an example of g(n). Step 604 also includes adding $p_i$ to g(n), thereby generating the output signal. As described above, interpolated signal 354 is an exemplary output signal.

III. Phase Balancing

Profile executor 104 has the flexibility of generating acceleration output signal 120 and position output signal 118, either in phase or out of phase, as desired for better performance. The total phase delay of each path can be adjusted using time delays, which are incurred by time delay components 322 and 346. These phase delays are quantitatively expressed below in Equations (2-1) and (2-2). Equation (2-1) represents the phase delay for acceleration signal path 312. Equation (2-2) represents the phase delay for position signal path 314.

$$\phi_A = \left(\frac{TFIRAS-1}{2} + TDA\right)FT \qquad (2\text{-}1)$$

$$\phi_P = \left(\frac{TFIRPS-1}{2} + 1\right)ST + \left(\frac{T_{eq}+1}{2} + TDP\right)FT \qquad (2\text{-}2)$$

For Equations (2-1) and (2-2):
TDA is the propagation delay of acceleration signal path 312;
ST is the slow clock rate period;
TFIRPS is the number of taps in filter 342;
TDP is the propagation delay of position signal path 314;
FT is the fast clock rate period;
$T_{eq}$ is the number of taps in the filters employed by interpolation component 344; and
TFIRAS is the number of taps in the filter employed by interpolation component 320.

Equation (2-2) includes an additional time delay of one slow clock rate period, ST. This term is included to account for the two stage double integration process described above that generates a correction signal.

Figure 7:
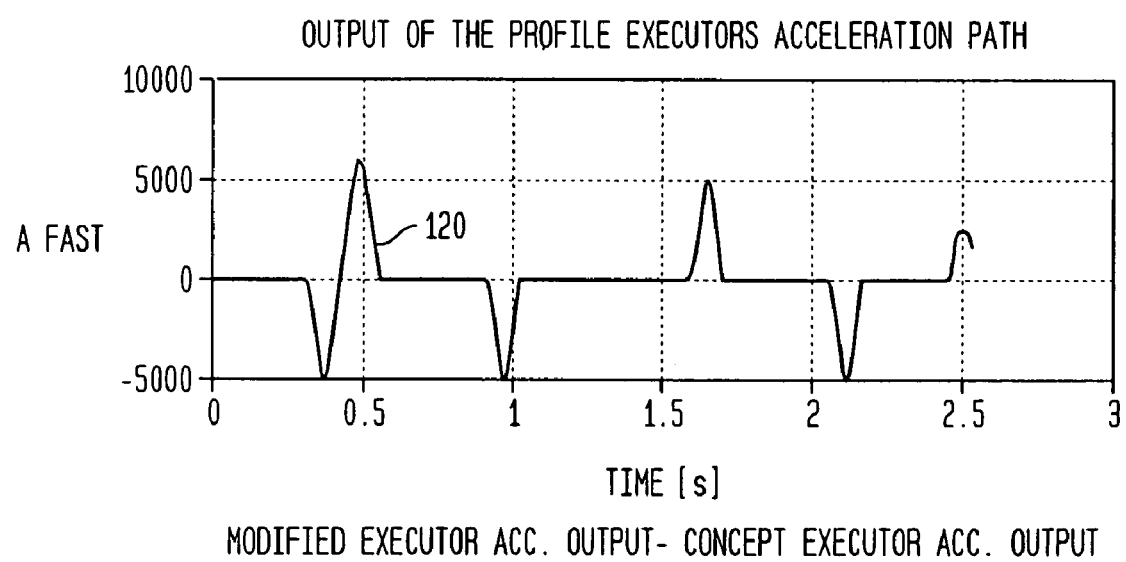
FIG. 7 is a graph illustrating an acceleration output signal.
Figure 8:
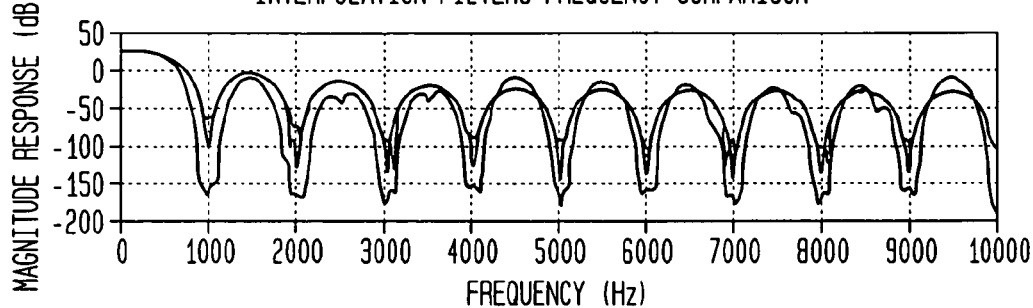
FIGS. 8–14 are graphs illustrating various filter responses.
Figure 9:
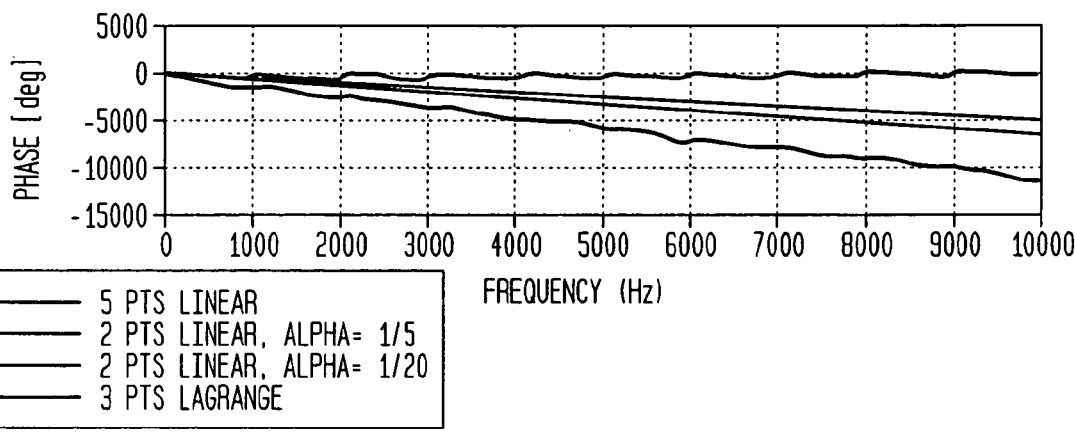
Figure 10:
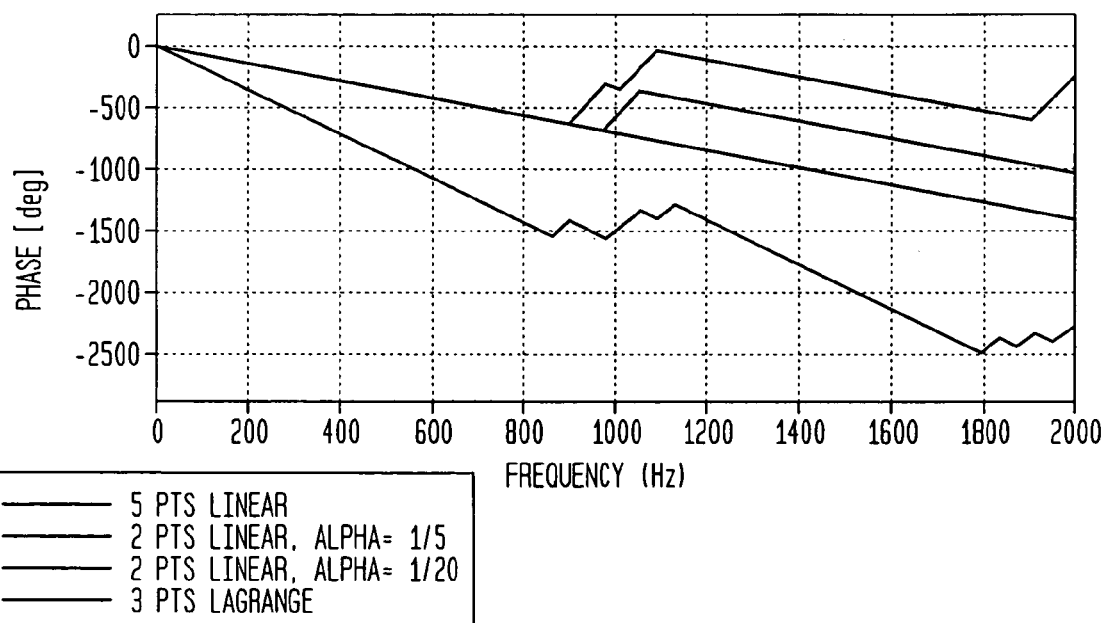
Figure 11:
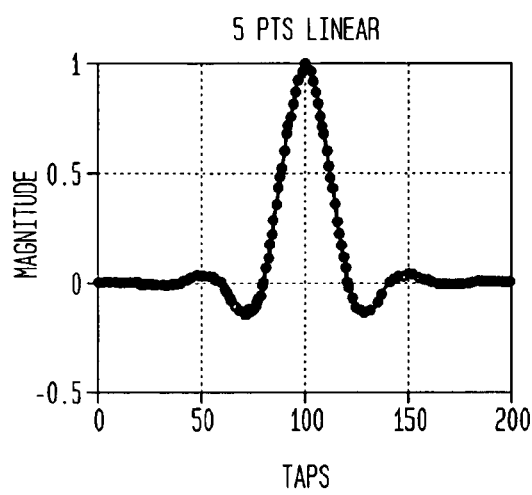
Figure 12:
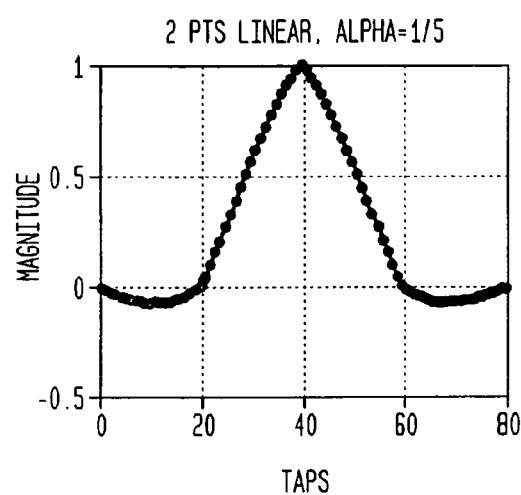
Figure 13:
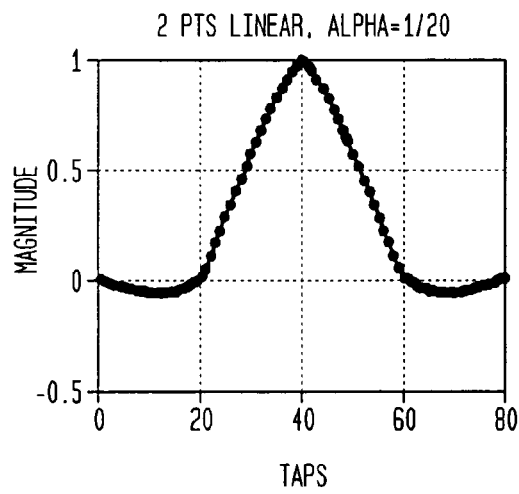
Figure 14:
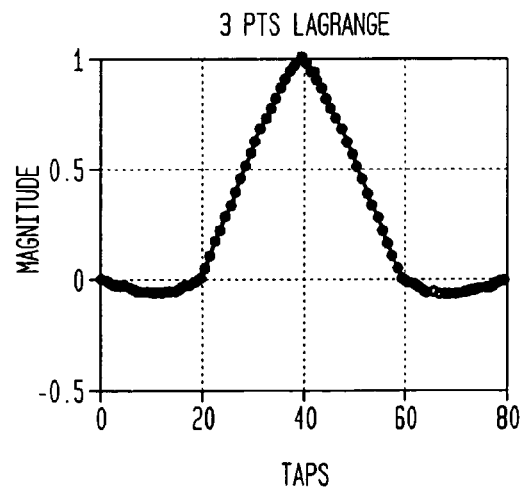

FIG. 7 is a graph illustrating acceleration output signal 120. This output signal is generated by profile executor 104 from state signal set 108, as described herein with reference to FIG. 2.

As described herein with reference to FIGS. 1–3, profile executor 104 generates an output signal set 116 that includes a position output signal 118 and an acceleration output signal 120. This signal set defines motion in a single axis. Devices, such as substrate and reticle stages, are capable of multi-dimensional (e.g., 3-D) motion. For such devices, a profile planner 102, a profile executor 104, and a control system 106 are employed for each dimension in which motion is to be controlled.

IV. Filtering Techniques

As described herein with reference to FIGS. 3–5, profile executor 104 includes filtering functionality. This functionality can be implemented with discrete time FIR filters. An FIR filter is a filter having an impulse response function that is finite in duration. These discrete time filters can also be implemented as infinite impulse response (IIR) filters. In contrast with FIR filters, IIR filters have impulse response functions that are infinite in duration.

The upsampling functions performed by interpolation components 320 and 344 are nonlinear. Because of these nonlinearities, the filtering properties performed by these interpolation components is critical. As described above, these components receive input signals at the slow clock rate and output corresponding reconstructed signals at the fast clock rate. Unless proper filtering techniques are employed, the nonlinearities associated with such reconstruction can introduce noise to signal paths 312 and 314.

Interpolation components 320 and 344 can employ various filtering designs. Once such design is a linear phase FIR filtering approach that performs ideal bandlimited interpolation using the nearest nonzero samples, when used on a sequence interleaved with L−1 consecutive zeros every L samples. It assumes an original bandlimitedness of $\alpha(0<\alpha\leq 1)$ times the Nyquist frequency.

A type of interpolation filter design is an FIR filtering approach that performs $n^{th}$-order Lagrange polynomial interpolation on a sequence interleaved with L−1 consecutive zeros every L samples. The filtering technique has length (n+1)*L for n even, and length (n+1)*L−1 for n odd. Where n is the number of taps used to perform the interpolation.

FIGS. 8–14 are a set of graphs that show the frequency responses of three different designs of the linear phase FIR filtering approach, and a Lagrange FIR filtering approach.

For the three linear phase FIR approaches, one of the approaches employs 5 taps filtering, while the two other approaches employ 2 taps filtering. For these 2 taps filtering approaches, α equals ⅕ and 1/20, respectively. The Lagrange approach employs only 3 taps.

As shown in FIGS. 8–14, the shapes of the linear phase 2 taps FIR filtering approaches, and the shape of the $3^{rd}$ order Lagrange filtering approach are similar. However, despite their name, the linear phase filtering approaches do not result in perfectly linear phases. Therefore, the Lagrange approach is preferred.

The errors introduced by these filtering approaches are expressed below in Equations (3-1) through (3-5). In these equations, $Y(\omega)$ represents the discrete time Fourier transform (DTFT) of the output signal of interpolation component 320 or interpolation component 344. Also, $H(\omega)$ represents the DTFT of the component's filtering function, and $X(\omega)$ represents the DTFT of a corresponding upsampled (i.e., interpolated) signal that is unfiltered.

Due to the convolution property of the Fourier transform, $Y(\omega)$ can be written as:

$$Y(\omega)=H(\omega)X(\omega) \qquad (3\text{-}1)$$

This relationship can also be expressed as $$Y(\omega)=|H(\omega)||X(\omega)|e^{-j(\phi[H(\omega)]+\phi[X(\omega)])} \qquad (3\text{-}2)$$

In Equation (3-2), $\phi$ represents signal phase.

The phase of any of the interpolation filtering approaches is expressed below in Equation (3-3).

$$\phi[H(\omega)]=\tilde{\phi}[H(\omega)]+\hat{\phi}[H(\omega)]=\beta\omega+\hat{\phi}[H(\omega)] \qquad (3\text{-}3)$$

In Equation (3-3), $\tilde{\phi}$ represents a linear phase component and $\hat{\phi}$ represents a nonlinear phase component. For the Lagrange filtering approach described above, this nonlinear component is zero. Thus, for the Lagrange approach, $Y(\omega)$ can be written as shown below in Equation (3-4).

$$Y(\omega)=|H(\omega)||X(\omega)|e^{-j(\beta\omega+\phi[X(\omega)])}e^{-j\hat{\phi}[H(\omega)]} \qquad (3\text{-}4)$$

From Equation (3-4) the inverse Fourier transform of $Y(\omega)$, $y(k)$, follows in Equation (3-5).

$$y(k)=\tilde{y}(k-\hat{\phi}[H(\omega)]) \qquad (3\text{-}5)$$

In Equation (3-5), $\tilde{y}(k)$ represents an ideal output. If $\hat{\phi}[H(\omega)]$ equals zero, then the outputs of interpolation components 320 and 344 are identical to theoretical outputs.

As described above, interpolation components 320 and 344 employ filtering operations on upsampled signals. For such interpolation components, a knowledge of the shape of the slow clock input signal enables the selection of an interpolation filtering technique that minimizes errors between the resultant interpolated signal and the original input data upon which the "slow clock" signal is based.

Interpolation component 344 utilizes shape information regarding integrated position signal 350 to minimize errors in interpolated signal 354. In the case of profile executor 104, position state signal 110 can be represented at any time, t, by a second order polynomial, as shown below in Equation (4-1):

$$P(t)=P(t_0)+V(t_0)(t-t_0)+\tfrac{1}{2}A(t_0)(t-t_0)^2 \qquad (4\text{-}1)$$

In Equation (4-1), P(t) represents integrated position signal 350, V(t) represents velocity state signal 112, A(t) represents acceleration state signal 114, and $t_0$ represents an initial time value.

Since integrated position signal 350 (as well as filtered position signal 352) can be represented as a second order polynomial, an ideal interpolation filter for integrated position signal 350 is tailored to "regenerate" a second order signal. A three tap (third order) Lagrange interpolation filter performs such second order regeneration. In addition, as described herein, such a filter has linear phase, which enables phase balancing of signals between acceleration signal path 312 and position signal path 314 when these paths do not use the same interpolation filter. Moreover, the Lagrange interpolation filter advantageously has a cut off frequency that is below the "fast clock" Nyquist frequency. Therefore, interpolation component 344 employs such three tap Lagrange filtering.

V. Control System

Figure 15:
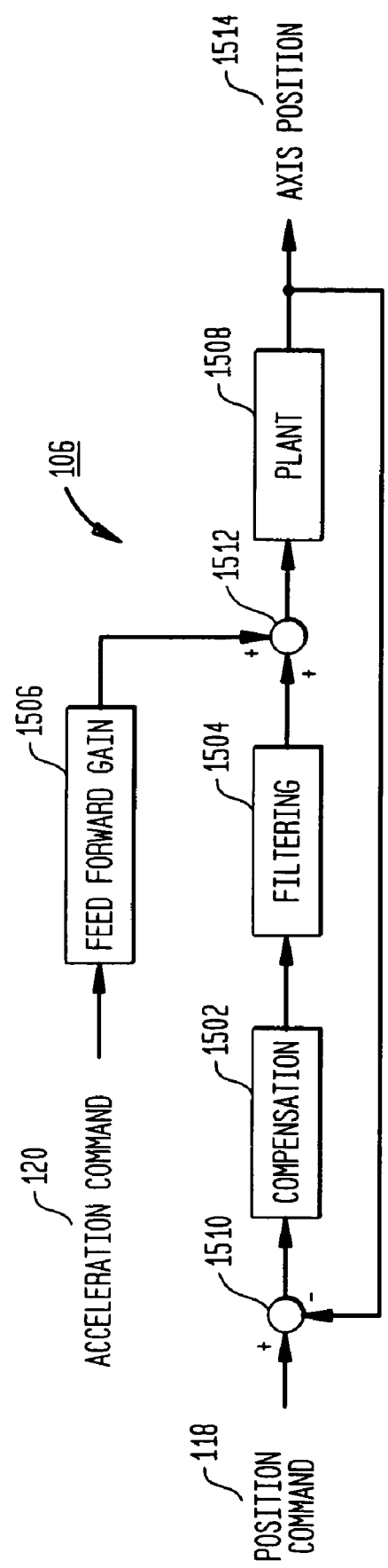
FIG. 15 is a block diagram of a control system.

FIG. 15 is a block diagram of a control system 106. Control system 106 includes a compensation module 1502, a filtering module 1504, a feed forward gain module 1506, a plant 1508, and summation nodes 1510 and 1512. Control system 106 receives position output signal 118 and acceleration output signal 120 from profile executor 104 and generates an axis position 1514. Axis position 1514 is a time varying signal that represents the motion of plant 1508.

Plant 1508 is a device, such as a substrate stage or a reticle stage, that is under the control of control system 106 through commands received from profile executor 104 in the form of output signal set 116.

VI. Efficient Interpolation and Filtering

Implementation 300 of profile executor 104 has multiple signal paths (i.e., signal paths 312 and 314). Each of these paths includes an interpolation component that performs upsampling and filtering functions on a discrete time input sequence. The present invention provides a technique to efficiently combine the performance of these functions. This technique advantageously enables these interpolation and filtering functions performed by interpolation component 320 of acceleration signal path 312 to be performed with a minimum number of processor operations. This minimization of processor operations shortens execution times and errors associated with the generation of output signal set 116.

Profile executor 104 receives state signal set 108 from profile planner 102. As described herein, state signal set 108 includes a plurality of discrete time signals. A discrete time signal is a train of pulses.

Interpolation component 320 is in acceleration signal path 312, which receives acceleration state signal 114. As described above with reference to FIG. 2, acceleration state signal 114 includes a series of substantially square pulses.

Figure 16A:
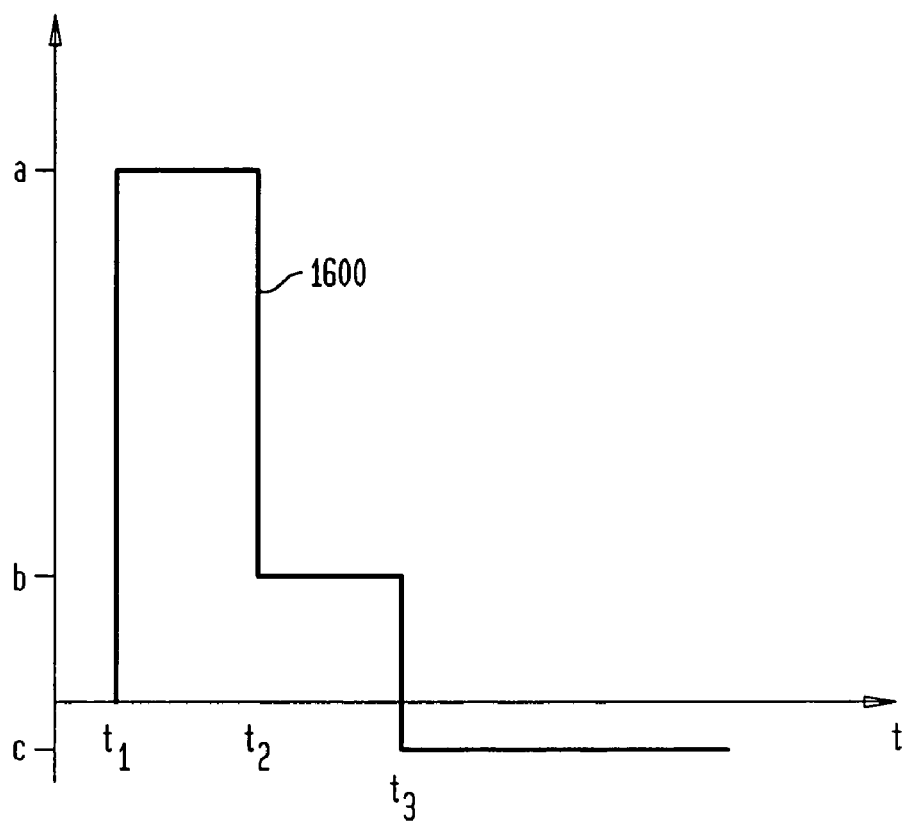
FIGS. 16A and 16B are graphs illustrating representations of an exemplary square signal.
Figure 16B:
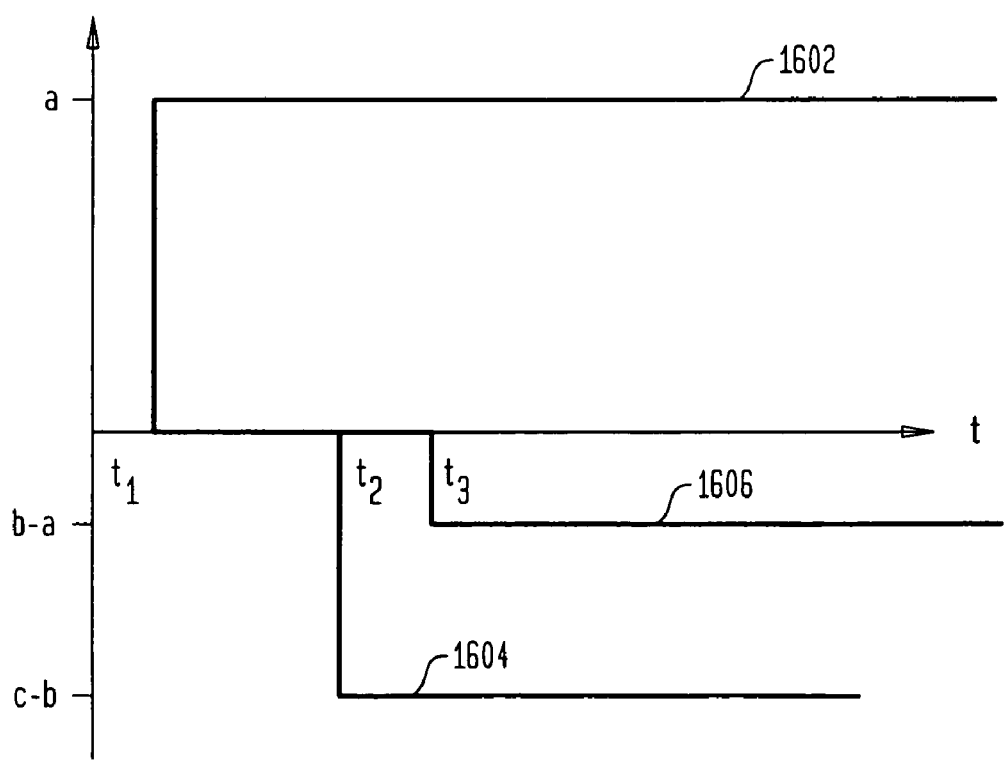

FIG. 16A is a graph illustrating an exemplary square signal 1600. Any square signal, such as acceleration state signal 114, can be expressed as a sequence of step signals that each have a predetermined amplitude and delay. This principle is shown in FIG. 16B, which shows square signal 1600 decomposed into a series of step signals 1602, 1604, and 1606. This step signal representation is expressed below in Equation (5-1).

$$A(t) = \sum_{k=1}^{3} \alpha_k \mu_k (t - T_k) \tag{5-1}$$

In Equation (5-1), A(t), represents square signal 1600, and $\alpha_k \mu_k(t-T_k)$ represents each of step signals 1602–1606 for k=1,3.

By viewing the upsampling and filtering functions performed by interpolation component 320 as a convolution of a series of boxcar filters having the same amplitude and duration as acceleration state signal 114, and an (deterministic) input signal having the impulse response function of the interpolation component 320 filtering approach described above, the number of operations required for interpolation component 320 to interpolate and filter the signal can be reduced.

Considering the square signal representation of Equation (5-1), an upsampling and filtering operation of this signal, as performed by interpolation component 320, is represented below in Equation (6-1).

$$A_f(t) = A(t) \otimes F(t) = \sum_{m=-\infty}^{\infty} F(t-m)A(m) = \sum_{k=1}^{3} \alpha_k \sum_{m=T_k}^{\infty} F(t-m) \tag{6-1}$$

In Equation (6-1), F(t) is an N length impulse response function of the filtering approach employed by interpolation component 320, where t=0, 1, 2, ..., N−1. But, F(α) is nonzero only if 0≤α≤N.

The most computationally expensive case occurs when two pulses (or steps) of different sign occur one after another without enough delay in between for the filter to settle within a filter length. By doing algebra, a long form expression of Equation (6-1) for this case is provided below in Equation (6-2).

$$A_f(t)=A_f(t-1)+\alpha_1 F(t-T_1)+\alpha_2 F(t-T_2)+\alpha_3 F(t-T_3) \tag{6-2}$$

In Equation (6-2), a1 is the amplitude of the first step, $a_3$ is the amplitude of the second step, and $a_2=a_1-a_3$.

Equation (6-2) illustrates that the number of operations required to perform the interpolation and filtering functions of interpolation component 320 is independent of filter length, N. Equation (6-2) reveals six operations (three multiplications and three additions) performed at the fast clock rate.

Another situation involves two pulses of smaller width than the employed FIR filter, with not sufficient time between the pulses to allow the filter to settle. In this situation:

$$A_f(t)=A_f(t-1)+a_1[F(t-T_1)-F(t-T_2)]+a_2[F(t-T_3)-F(t-T_4)] \tag{6-3}$$

The calculation performed in Equation (6-3) requires only 5 operations. Other cases exist within the present invention that require fewer calculations. As long as the employed filter length is smaller or equal to the delay allocated for filter settling, no other computationally intensive cases are possible.

In general, the efficient filtering and interpolation technique is expressed below in Equation (7-1).

$$A_f(t) = A_f(t-1) + \sum_{k=1}^{L} \alpha_k [F(t-T_k) - F(t-T_{k+1})] \tag{7-1}$$

In Equation (7-1), L is the maximum number of input pulses that can occur during filter length, N. Also, in Equation (7-1), each occurrence of $F(t-T_j)$ is an FIR filter coefficient corresponding to one of the delayed input step functions represented in Equation (5-1).

The efficient filtering and interpolation approach described in Equation (7-1) provides a reduction in operations from 2*N to 3*L. Therefore, when L<<N, substantial gains in computational efficiency and error minimization are achieved.

FIG. 17 is a flowchart illustrating an operational sequence of efficient filtering and interpolation as described above. This operation begins with a step 1702. In step 1702, profile executor 104 selects a plurality of input signal values from an input signal, such as acceleration state signal 114. Each selected input signal value corresponds to a particular time increment at the slow clock rate. The performance of this step comprises the step of representing a square signal as a set of step signals, as shown in Equation (5-1).

Next, in a step 1704, profile executor 104 generates, at a time increment occurring at the fast clock rate, an output signal value. Step 1704 comprises the steps of calculating a sum of products and adding this sum of products with a prior time increment output signal value. These calculating steps are expressed above in Equation (7-1).

Step 1704 can be repeated at time increments occurring at the fast clock rate to produce a plurality of output signal values. This produces a complete interpolated signal 330.

VII. Efficient Interpolation—Zero Padding

The present invention includes a technique for efficiently performing filter operations in an interpolation process. This technique takes advantage of zeros added during upsampling to reduce the filtering operation's computational load. Interpolation component 344 utilizes this technique.

Figure 18:
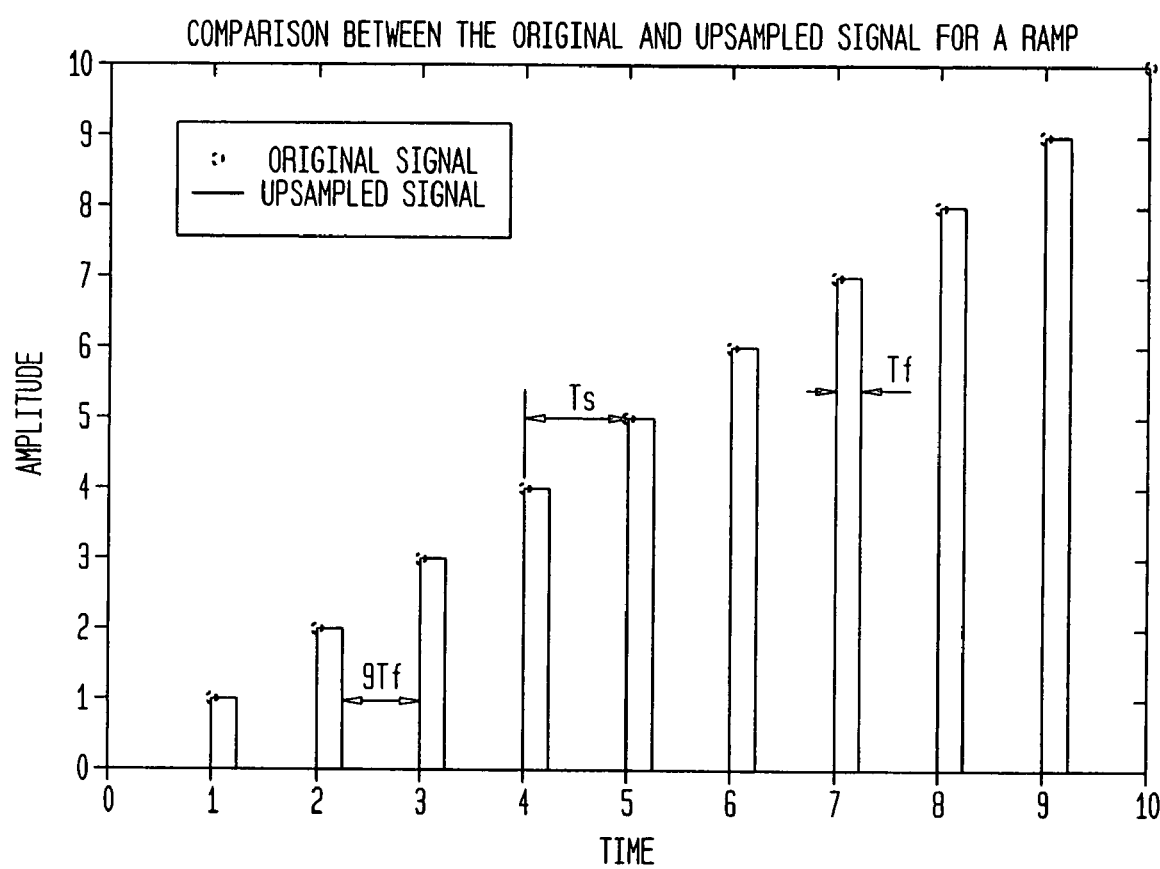
FIG. 18 is a graph illustrating a ramp function at a slow clock rate that has been upsampled.

Interpolation is performed by interpolation components 344 and 320. As described above, interpolation involves upsampling and filtering processes. To upsample an unknown signal with a sampling rate $T_S$ to a faster sampling period $T_f=T_S/R$, where R is an integer, R−1 zeros are introduced between samples. For example, if $T_S=64$ microseconds and $T_f$ is 1 microsecond, then such upsampling involves inserting 63 zeros between samples. FIG. 18 is a graph illustrating a ramp function at a slow clock rate that has been upsampled by a factor of ten.

As shown in FIG. 18, the upsampled signal is only equal to the original signal at the original "slow clock" intervals. In order to "interpolate" the points between such "slow clock" intervals, the upsampled signal needs to be filtered at the fast clock rate. This interpolation filtering can be performed by any low pass filter having a cut off frequency that is at or below the Nyquist frequency associated with the "fast clock." Exemplary filters are described above with reference to FIGS. 8–14.

The introduction of zeros by an interpolation's upsampling process is referred to herein as "zero padding." Interpolation component 344 takes advantage of this zero padding to reduce the number of operations required by its respective filtering operation. Provided below is a mathematical analysis describing this efficient interpolation filtering feature.

As described herein, interpolation component 344 performs upsampling and filtering functions from a slow clock rate to a fast clock rate. These functions have an interpolation ratio of R, which is expressed below in Equation (8-1).

$$R = \frac{T_s}{T_f} \tag{8-1}$$

In Equation (8-1), $T_S$ represents the slow clock rate and $T_f$ represents the fast clock rate.

Using FIR filtering as an example, each interpolation component's filtering operation, the output, y(t), of an "N" taps FIR filter is represented by Equation (8-2).

$$y(t) = \sum_{i=0}^{N-1} b_i u(t - iT_f) \tag{8-2}$$

In Equation (8-2), $b_i$ represents the $i^{th}$ filter coefficient, u(t) represents the input signal at a time t, and $T_f$ represents the fast clock sampling period.

By letting $u(t-kT_f)$ (k=0, 1, 2, ..., R−1) be the last value of the non-interpolated signal (notice that $kT_f$ is a multiple of the slow clock) then the previous R−1 samples are zeros, as expressed below in Equation (8-3).

$$u(t-iT_f)=0, \text{ where } i=(k+1), (k+2), \ldots, (k+R-1) \tag{8-3}$$

Next, by letting $t-kT_f=mT_s-kT_f$, where $T_s$ is the slow clock sampling period, then Equation (8-3) can be expressed as shown in Equation (8-4), below.

$$u(mT_s-kT_f-iT_f)=0 \tag{8-4}$$

Equation (8-4) holds true for i=0, 1, ... R−1. Through Equation (8-4), Equation (8-2) can now be expressed, as shown below in Equation (8-5).

$$y(t) = \sum_{i=0}^{N-1} b_i u(t - iT_f) = \sum_{i=0}^{N-1} b_i u(mT_s - iT_f) \tag{8-5}$$
$$= \sum_{i=k}^{ceil[(N+1-k)/R]-1} b_{iR-k} u((m-i+k)T_s); m = 0, 1, 2, 3, \ldots$$

In Equation (8-5), the function ceil(A) rounds A to the nearest integer that is greater than or equal to A.

Equation (8-5) performs an interpolation filtering operation in a minimum number of operations. This minimum number of operations is expressed in Equation (8-6). In general operations of profile executor, N−1 is greater than R.

$$2ceil[(N+1)/R]-1 \tag{8-6}$$

The description now turns to an example of interpolation filter optimization using a 3 taps (N=3) FIR filtering process and an interpolation factor of 2 (R=2). Equation (9-1) is an expression of an output sequence generated by this example interpolation process.

$$y(t)=b_0 u(t)+b_1 u(t-T_f)+b_2 u(t-2T_f) \tag{9-1}$$

In Equation (9-1), u(t) represents the input to the interpolation filtering process, y(t) represents the process output. The coefficients $b_0$, $b_1$, $b_2$ represent the FIR filtering coefficients.

By letting $u(t-kT_f)=u(mT_s)$ (where k=0, 1; and where m=1, 2, 3 ...), features of input sequence, u(k), are shown in Equations (9-2) and (9-3).

$$u(t-(k+1)T_f)=0 \tag{9-2}$$

$$u(t-(k+2)T_f)=u((m-1)T_s) \tag{9-3}$$

if k=0→u(t)=u($mT_s$)→u(t−$T_f$)=0→u(t−2$T_f$)=u($mT_s$−$T_s$)
→y(t)=$b_0$u($mT_s$)+$b_2$u($mT_s$−$T_s$)

if k=1→u(t)=0→u(t−$T_f$)=u($mT_s$)→u(t−2$T_f$)=0→y(t)=$b_1$u($mT_s$)

Thus, the maximum number of operations required for this example is expressed in Equation (9-4).

$$2ceil[(N+1)/R]-1=2ceil[(3+1)/2]-1=3 \tag{9-4}$$

As shown in Equation (9-4), only 3 operations are required to perform this example interpolation filtering function.

This feature also applies to a series of a plurality of convolved filters, such as FIR filters. A series of FIR filters is equivalent to one FIR filter. The response function of this equivalent filter is the discrete convolution of all the FIR filters in the series. Therefore, the number of taps of this equivalent FIR filter is the sum of the number of taps of the convolved individual filters. An example of two filters arranged in series, such as an FIR filter within interpolation component 344 and a post interpolation filter (not shown) coupled to the output of interpolation component 344 is provided below.

Let $N_i$ represent the number of taps of a first FIR filter having a plurality of filter parameters $b_k$ (k=0, 1, 2, ... $N_i$−1), and $N_S$ represent the number of taps of a second FIR filter in series with the first FIR filter. The second FIR filter has $N_S$ taps, and a corresponding plurality of filter parameters $c_l$ (l=1, 2, ... $N_S$−1). The resulting parameters of the filter resulting from the convolution of the first and second filters are expressed below in Equation (10-1).

$$d_n = \sum_{m=0}^{n} c_m b_{n-m} \quad (n = 0, 1, 2, \ldots, N_s + N_i) \tag{10-1}$$

In Equation (10-1):

$$c_m = \begin{cases} c_m & \text{if } 0 \leq m \leq N_s - 1 \\ 0 & \text{otherwise} \end{cases}$$

$$b_{n-m} = \begin{cases} b_{n-m} & \text{if } 0 \leq n - m \leq N_i - 1 \\ 0 & \text{otherwise} \end{cases}$$

Thus, using the efficient interpolation filtering techniques, the output of these two series filters is expressed below in Equations (10-2) and (10-3).

$$y(t) = \sum_{i=0}^{N_i+N_s-1} d_i u(t - iT_f) = \sum_{i=0}^{N_i+N_s-1} d_i u(mT_s - iT_f) \quad (10\text{-}2)$$

$$y(t) = \sum_{i=k}^{ceil[(N_i+N_s+1-k)/R]-1} u\left[u((m-i+k)T_s)\sum_{j=0}^{i} c_j b_{iR-j}\right] \quad (10\text{-}3)$$

The total number of operations required to obtain the output, as expressed in Equation (10-3), is expressed below in Equation (10-4).

$$2 ceil[(N_s+N_i+1)/R]-1 \quad (10\text{-}4)$$

An example of this series filtering is now described with reference to profile executor 104. An exemplary interpolation component 344 employs a 79 taps FIR filter, and a post-interpolation filter (not shown) that filters interpolated signal 354 is a 50 taps FIR filter. In this example, interpolation component 344 performs a 20 times upsampling operation on signal 352. A conventional series filtering approach requires 79*2+50*2=258 operations.

However, by employing the efficient interpolation filtering feature, the number of operations required to perform this interpolation filtering is reduced to 13 operations, as shown below in Equation (10-5).

$$2 ceil[(79+50+1)/20]-1=13 \quad (10\text{-}5)$$

This reduction of operations not only reduces the number of operations, but also reduces errors accumulated through computations performed by processing platforms, such as those employing limited precision arithmetic. This feature is performed at the fast clock rate.

VIII. Implementation

Figure 19:
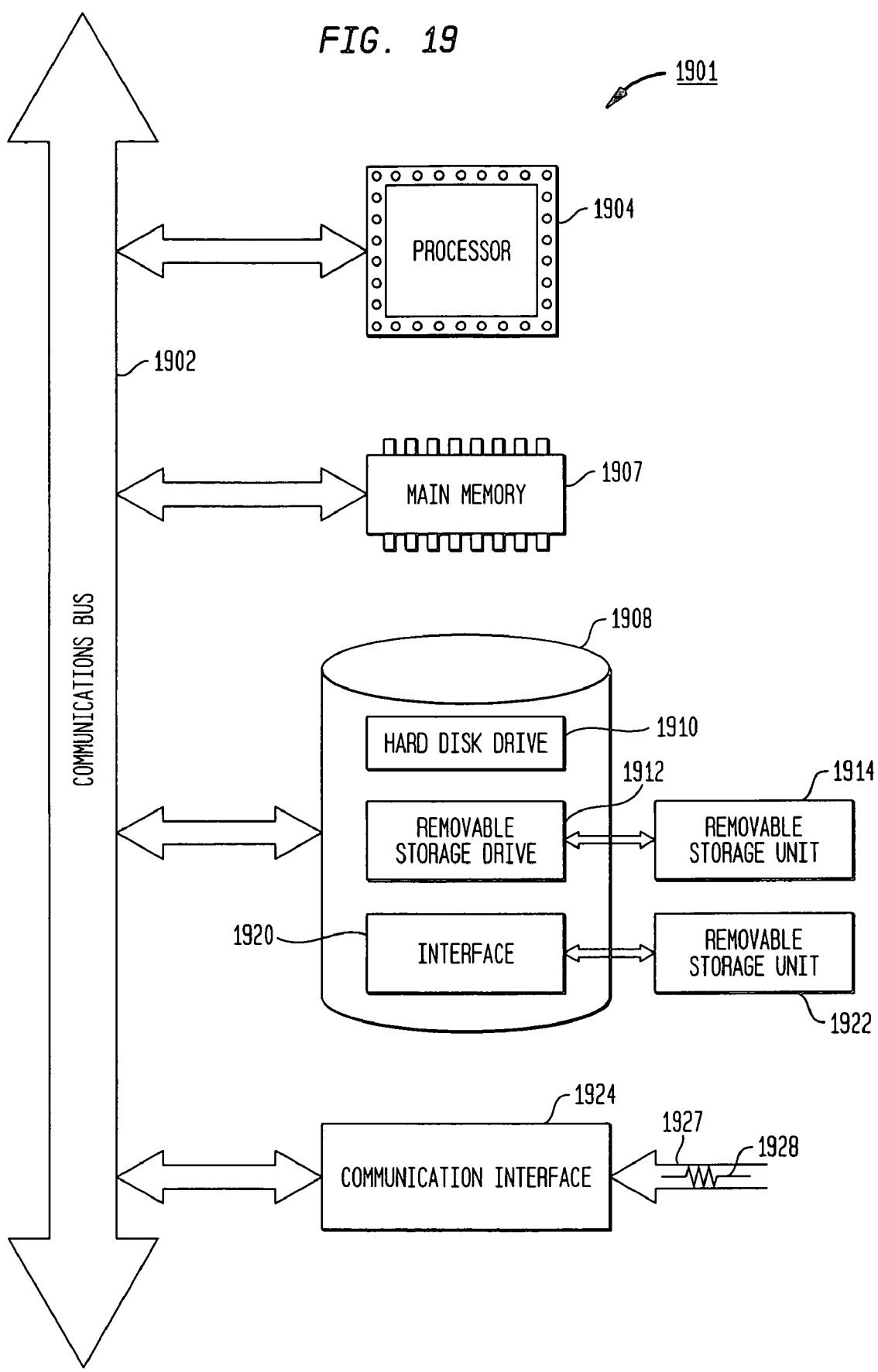
FIG. 19 is a block diagram of an exemplary computer system.

The functionality described herein may be implemented using hardware, software or a combination thereof and may be implemented in a computer system or other processing system. In fact, in one embodiment, the invention is directed toward a computer system capable of carrying out the functionality described herein. An exemplary computer system 1901 is shown in FIG. 19. Computer system 1901 includes one or more processors, such as a processor 1904. The processor 1904 is connected to a communication bus 1902. Various software embodiments are described in terms of this example computer system. After reading this description, it will become apparent to persons skilled in the relevant art how to implement the invention using other computer systems and/or computer architectures.

Computer system 1901 also includes a main memory 1907, preferably random access memory (RAM), and can also include a secondary memory 1908. The secondary memory 1908 can include, for example, a hard disk drive 1910 and/or a removable storage drive 1912, representing a floppy disk drive, a magnetic tape drive, an optical disk drive, etc. The removable storage drive 1912 reads from and/or writes to a removable storage unit 1914 in a well known manner. Removable storage unit 1914, represents a floppy disk, magnetic tape, optical disk, etc. which is read by and written to by removable storage drive 1912. As will be appreciated, the removable storage unit 1914 includes a computer usable storage medium having stored therein computer software and/or data.

In alternative embodiments, secondary memory 1908 may include other similar means for allowing computer programs or other instructions to be loaded into computer system 1901. Such means can include, for example, a removable storage unit 1922 and an interface 1920. Examples of such can include a program cartridge and cartridge interface (such as that found in video game devices), a removable memory chip (such as an EPROM, or PROM) and associated socket, and other removable storage units 1922 and interfaces 1920 which allow software and data to be transferred from the removable storage unit 1922 to computer system 1901.

Computer system 1901 can also include a communications interface 1924. Communications interface 1924 allows software and data to be transferred between computer system 1901 and external devices. Examples of communications interface 1924 can include a modem, a network interface (such as an Ethernet card), a communications port, a PCMCIA slot and card, etc. Software and data transferred via communications interface 1924 are in the form of signals which can be electronic, electromagnetic, optical or other signals capable of being received by communications interface 1924. These signals 1928 are provided to communications interface 1924 via a channel 1927. This channel 1927 carries signals 1928 and can be implemented using wire or cable, fiber optics, a phone line, a cellular phone link, an RF link and other communications channels.

In this document, the terms "computer program medium" and "computer usable medium" are used to generally refer to media such as removable storage device 1912, a hard disk installed in hard disk drive 1910, and signals 1928. These computer program products are means for providing software to computer system 1901.

Computer programs (also called computer control logic) are stored in main memory 1907 and/or secondary memory 1908. Computer programs can also be received via communications interface 1924. Such computer programs, when executed, enable the computer system 1901 to perform the features of the present invention as discussed herein. In particular, the computer programs, when executed, enable the processor 1904 to perform the features of the present invention. Accordingly, such computer programs represent controllers of the computer system 1901.

In an embodiment where the invention is implemented using software, the software may be stored in a computer program product and loaded into computer system 1901 using removable storage drive 1912, hard drive 1910 or communications interface 1924. The control logic (software), when executed by the processor 1904, causes the processor 1904 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software. Examples of such combinations include, but are not limited to, microcontrollers.

IX. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of efficiently processing a discrete time input signal having a plurality of input signal samples that occur at a first clock rate into a discrete time output signal having a second clock rate that is R times the first clock rate, the method comprising the steps of:
receiving the input signal; and
filtering the input signal with an N-taps finite impulse response (FIR) filter having N filter coefficients according to $$\sum_{i=k}^{ceil[(N+1-k)/R]-1} b_{iR-k} u((m-i+k)T_s)$$

wherein $b_{iR-k}$ is one of the N filter coefficients, $u((m-i+k)T_s)$ is one of the input signal samples, $T_s$ is a slow clock sampling period, m equals (0, 1, 2, 3, . . . ), and k equals (0, 1, 2, . . . , R−1).

2. The method of claim 1, wherein the input signal is a position signal.

3. The method of claim 1, wherein each of the N filter coefficients is the result of a discrete convolution of a series of FIR filters.

4. The method of claim 1, wherein the output signal is sent to a control system that controls a photolithography scanning operation.

5. A system for efficiently processing a discrete time input signal having a plurality of input signal samples that occur at a first clock rate into a discrete time output signal having a second clock rate that is R times the first clock rate, the system comprising:
means for receiving the input signal; and
means for filtering the input signal with an N-taps finite impulse response (FIR) filter having N filter coefficients according to $$\sum_{i=k}^{ceil[(N+1-k)/R]-1} b_{iR-k} u((m-i+k)T_s)$$

wherein $b_{iR-k}$ is one of the N filter coefficients, $u((m-i+k)T_s)$ is one of the input signal samples, $T_s$ is a slow clock sampling period, m equals (0, 1, 2, 3, . . . ), and k equals (0, 1, 2, . . . , R−1).

6. The system of claim 5, wherein the input signal is a position signal.

7. The system of claim 5, wherein each of the N filter coefficients is the result of a discrete convolution of a series of FIR filters.

8. The system of claim 5, wherein the output signal is sent to a control system that controls a photolithography scanning operation.

* * * * *